United States Patent [19]
Duong et al.

[11] Patent Number: 5,688,169
[45] Date of Patent: Nov. 18, 1997

[54] ELECTRICAL EQUIPMENT CABINET COOLING

[75] Inventors: Quang Duong, Denville; Stephen John Palaszewski, Chester, both of N.J.

[73] Assignee: Lucent Technologies Inc., Murray Hill, N.J.

[21] Appl. No.: 611,583

[22] Filed: Mar. 6, 1996

[51] Int. Cl.$^6$ .................................................. H05K 5/00
[52] U.S. Cl. ................................................ 454/184; 454/186
[58] Field of Search ......................................... 454/184, 186

*Primary Examiner*—Henry A. Bennett
*Assistant Examiner*—Derek S. Boles

[57] ABSTRACT

For cooling cabinets housing electrical equipment, fans are used for pulling internal air upwardly through the electronic equipment into a common space beneath the roof of the cabinet. Baffles within the space distribute the heated air in desired patterns across the inside roof surface and to ducts mounted on interior surfaces of external vertical walls of the cabinet for cooling the air by heat exchange through the roof surface and the vertical cabinet walls. In a second arrangement, an attic-like structure having a thermally insulated roof is mounted on the cabinet roof. External air is blown through the attic-like structure and across the cabinet roof for enhanced cooling of cabinet-heated air beneath the cabinet roof.

9 Claims, 2 Drawing Sheets

ELECTRICAL EQUIPMENT CABINET COOLING

BACKGROUND OF THE INVENTION

This invention relates to cabinets for enclosing electrical equipment, e.g., communication equipment disposed at outdoor locations, and particularly to means for cooling the cabinets.

U.S. Pat. No. 5,150,277, issued to myself and G. D. Bainbridge, discloses two arrangements for cooling electrical equipment enclosing cabinets. The present invention relates to variations of, and improvements over, the arrangements disclosed in that patent, the subject matter of which is incorporated herein by reference.

Both patented arrangements involve cooling by forced air flow. In a first arrangement, a fan is disposed within and at the bottom of a cabinet, directly below a bank of equipment, and the fan drives internal air first horizontally towards a vertical door of the cabinet, upwardly along an internal surface of the door, then horizontally and downwardly past the electrical equipment. The downwardly flowing air cools the electrical equipment, and the heated air is cooled by passage along the door inner surface. In normal rated operation, the internal temperature of the cabinet can be around 75 degrees C. (167 degrees F.), which is well above typical outdoor temperatures. The cabinet door is preferably of metal, and heat exchange occurs between the heated, upwardly flowing internal air and the cooler outside air.

The cabinets shown in my patent are fairly typical of cabinets used for housing communications equipment and, although not disclosed in the patent, an upper space of the cabinets is more or less filled with cables and other equipments providing electrical interfaces with electronic devices housed in a central portion of the cabinets. Circulation of internal air within this upper space is generally quite limited and no attempt is made to cool this space by internal flow of air. Accordingly, for preventing excessive heating of this upper space by the sun, the cabinet roofs are typically thermally insulated for minimizing heat exchange through the cabinet roofs.

In both arrangements disclosed in my patent, the cabinet contains two banks of equipment disposed back to back and facing in opposite directions towards the access doors located on opposite sides of the cabinet. Each bank is separately cooled, making use of separate fans, and the air heated by each bank is cooled by passage solely over the internal surface of an access door facing the bank. It is recognized that additional cooling can be obtained by the provision of additional heat exchanging surfaces, and in the second arrangement disclosed in my patent, a hollow heat exchange unit is disposed within the cabinet between the two banks of equipment. The unit comprises two spaced apart vertical walls facing in opposite directions towards respective ones of the banks. Outdoor air is circulated within the heat exchange unit for providing two additional vertical wall surfaces, equivalent to the door surfaces used in the first arrangement, for cooling heated air flowing within the cabinet. A problem, however, is that the internal hollow heat exchange unit takes up space within the cabinet and is relatively expensive.

SUMMARY OF THE INVENTION

In accordance with one aspect of the invention, forced air cooling of a cabinet is provided as in my aforecited patent but wherein, in addition to front and rear door vertical surfaces used for heat exchange, one or more oppositely disposed side walls of the cabinet and the cabinet roof are also used as heat exchangers. This is achieved by the use of one or more fans for forcing equipment heated air to flow into a generally open space underlying a thermally conductive roof of the cabinet. Baffles within the space direct the heated air in different horizontal directions both along the roof internal surface and towards an encircling, continuous duct for causing downward flow of the heated air along internal surfaces of the side walls. Heat exchange between the flowing, heated air and outside air occurs through the cabinet roof and through the cabinet side walls. The thus cooled air then flows horizontally inwardly of the cabinet and upwardly past the heat generating electrical equipment within the cabinet and back to the roof underlying space. Accordingly, in comparison with the cooling arrangements disclosed in my patent, additional heat exchanging surfaces are provided but without the use of a separate, internal heat exchange unit cooled by forced flow of external air.

In accordance with a second aspect of the invention, enhanced heat exchange through a cabinet "roof" (as defined hereinafter) is obtained by covering the cabinet "roof" with a separate heat exchange unit comprising a hollow enclosure having a thermal insulating roof and side walls. Outside air is blown through the enclosure by a fan for cooling the covered cabinet roof while isolating it from the sun. In contrast to the second arrangement disclosed in my patent, the separate heat exchange unit is disposed entirely "exteriorly" (as defined hereinafter) of the cabinet.

DESCRIPTION OF THE DRAWING

The drawings are schematic and not necessarily to scale.

DESCRIPTION OF PREFERRED EMBODIMENTS

Figure 1:
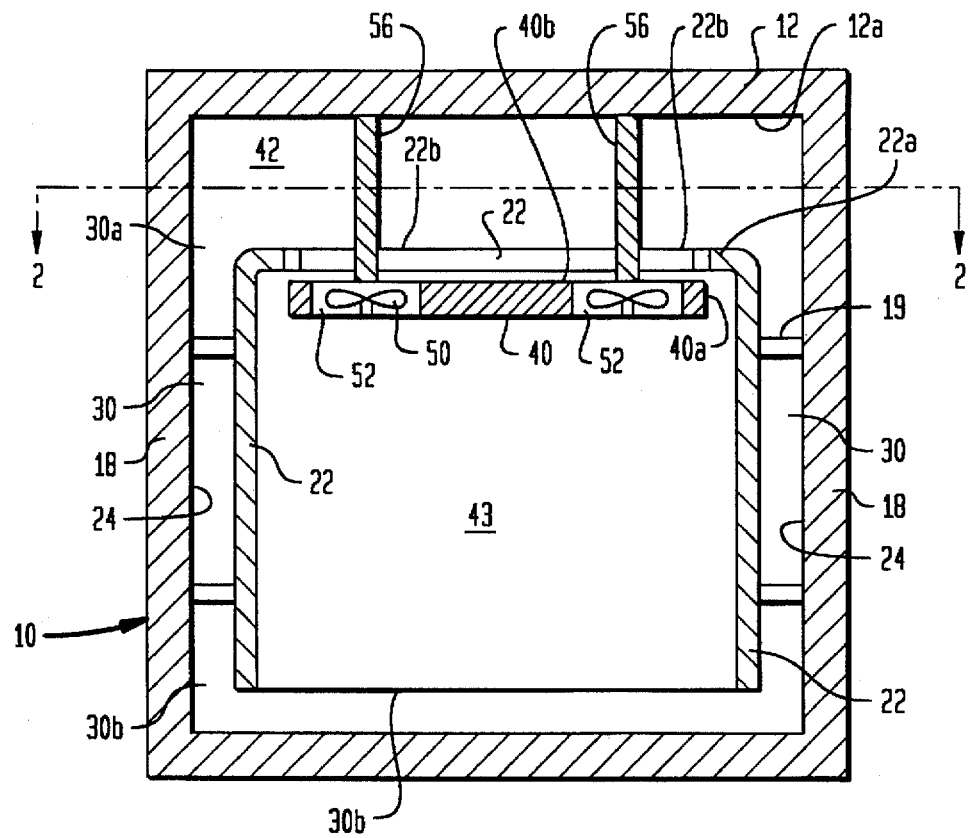
FIG. 1 is a side elevation of a cabinet in accordance with a "first" cooling arrangement according to the invention.
Figure 2:
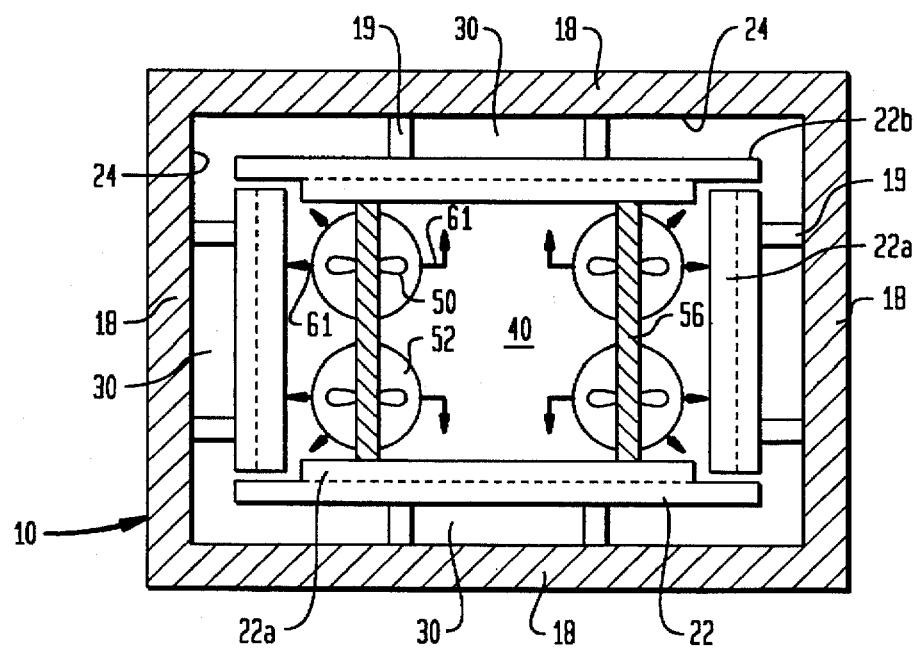
FIG. 2 is a cross-section of the cabinet shown in FIG. 2 along line 2—2 of FIG. 1.

With reference to FIGS. 1 and 2, a cabinet 10 in accordance with the present invention is shown. The cabinet, at least with respect to its function for housing various electrical equipment, can be in accordance with known cabinets and, for example, can be configured as shown in my earlier patent (U.S. Pat. No. 5,150,277).

FIGS. 1 and 2 illustrate a cabinet cooled only by a "first" of two cooling arrangements herein disclosed. The first cooling arrangement is disposed interiorly of the cabinet and, similarly as in my earlier patent, relies upon forced flow of internal cabinet air along internal surfaces of external walls of the cabinet for cooling the heated internal air by heat exchange to cooler outside air.

The cabinet has small vents to the outside air when the cabinet doom (or door) are closed to promote pressure and absolute humidity equalization. The vents are not intended to allow outside air into the cabinet for cooling purposes. FIGS. 1 and 2 show the cabinet 10 in its closed condition, and no attempt is made to illustrate the door(s) of the cabinet.

In accordance with this invention, vertical side walls 18 of the cabinet 10, and preferably all the vertical side walls, are used as heat exchangers. To this end, a plate 22 is mounted on each of the side walls 18 of the cabinet by means of posts 19 in spaced apart, parallel relationship with a corresponding wall internal surface 24. Each plate 22 and its facing wall surface 24 form a vertically extending duct 30 for the passage of air. The plates 22 are preferably continuous, i.e., without apertures therethrough, and heated air which passes into the ducts 30, from the upper ends 30a thereof, as hereinafter described, flows smoothly downward through the ducts for emergence at the lower ends 30b thereof.

The disclosed duct cooling arrangement is similar to that used in my earlier issued patent. Therein, the cabinet being cooled is sub-divided into two separate halves, and a fan mounted on a bottom shelf in each half of the cabinet blows air horizontally outwardly towards a respective door serving respective front and rear sides of the cabinet. Duct-forming plates are mounted on each door, and each door serves as a heat exchange unit for a respective half of the cabinet. Only the oppositely disposed doors of the cabinets are so used, however, and no attempt is made to utilize the cabinet side walls interconnecting the front and rear doors or the roof of the cabinet as heat exchangers. Indeed, as previously noted, the roofs of the cabinets disclosed in the patent are preferably thermally insulated to prevent solar heating of the space immediately underlying the roofs.

My earlier patent recognizes that the presence of additional vertical heat exchange surfaces adds cooling capacity. However, the only arrangement then thought of and disclosed is the use of a separate heat exchange unit disposed within the cabinet between the two cabinet half sections and the use of forced external air flow. Such separate heat exchange unit (the aforementioned "second" cooling arrangement disclosed in my patent) is relatively complicated, expensive and takes up valuable space within the cabinet.

In accordance with the presently described "first" cooling arrangement, use is made of additional vertically extending, external walls of the cabinet, and preferably all the side walls, as heat exchangers without the use of a separate, internal heat exchange unit as in my patent. Additionally, the roof of the cabinet is used as heat exchanger.

To these ends, vertically extending duct forming plates 22, as previously described, are preferably mounted on all the cabinet vertical walls 18. As in my earlier patent, two oppositely disposed walls can comprise doors for the cabinet, but the ducting structure is so simple that, with the doors closed, all the ductwork on all the walls are substantially identical.

As shown in FIG. 2, the horizontal side edges 22a of adjacent duct forming plates 22 closely adjoin one another whereby a basically continuous duct is formed completely around the inside of the cabinet. Heated air is forced to flow through the continuous duct, preferably uniformly distributed through the entire cross-section thereof, for uniformly cooling the air.

This is accomplished by the provision of a horizontal shelf 40 mounted within the cabinet and spaced slightly below the roof 12 of the cabinet. The shelf 40 forms a basically open space 42 at the top of the cabinet directly beneath the cabinet roof 12. The shelf 40 extends entirely across the lateral extent of the cabinet and has peripheral edges 40a which closely adjoin each of the duct forming plates 22. The top edges of the plates are preferably provided with inwardly extending horizontal ledges 22a which overlap the peripheral edges 40a of the shelf so closely as to be practically hermetically sealed thereto. The degree of "hermeticity" is not critical except, as hereinafter described, any air from the top space 42 which by-passes the ducts 30 and passes directly into the cabinet interior is not properly cooled.

In the present embodiment, four electrically driven fans 50 are mounted within vertical openings 52 through the shelf 40 for blowing air within the cabinet below the shelf 40 through the shelf and into the upper space 42. The upwardly-driven air causes an increase in air pressure within the space 42 in excess of the pressure within the cabinet below the shelf 40, and the thus pressurized air is forced into the cabinet peripheral ducts 30 encircling the space 42.

The air within the space 42 also flows along the internal surface 12a of the roof which also acts as a heat exchanger for cooling hot internal air to cooler outside air. To this end, the roof 12, contrary to typical prior art practice, is preferably made of a high thermal conductivity material, e.g., aluminum. In the arrangement shown in FIGS. 1 and 2, the roof 12 is directly exposed to the sun. However, even though solar heating of the roof 12 can occur, the heated, internal air within the space 42, blown directly into the space 42 from the underlying equipment containing space 43, is so hot, e.g., around 75 degrees C., that effective cooling occurs in spite of any solar heating. In the cabinets disclosed in my patent, air is not force flowed through the space directly beneath the roof, and what air is therein present tends to stay in place. Accordingly, as previously mentioned, the prior art roofs are thermally insulated to prevent inflow of solar heat. The key to obtaining heat outflow is to continuously force heated air into the roof underlying space so that the internal space remains at a relatively high temperature relative to the temperature of the outside surface of the roof, and to rapidly flow the internal air past the roof internal surface for effective heat exchange. This is accomplished according to the invention.

The greater the air flow rate, the greater (to a maximum) is the heat exchange. This is a matter of choice dependent upon the particular cabinet being cooled.

The air within the space 42 additionally flows downwardly through the peripheral ducts 30 and past the interior surfaces 24 of the cabinet external walls 18. The air then passes laterally outwardly from the lower ends 30b (FIG. 1) of the ducts 30, rises within the cabinet within and past electrical equipment (not shown) disposed within the cabinet space 43 beneath the shelf 40, and eventually reaches the shelf-mounted fans 50 to repeat the cycle. The rising cabinet interior air removes heat from the electrical equipment, and the air flowing downwardly past the internal wall surfaces 24 (the walls 18 being, e.g., of aluminum) is cooled by heat exchange to the surrounding outside air.

To the extent that heat is uniformly generated throughout the interior space of the cabinet, maximum cooling efficiency and the avoidance of hot spots within the cabinet are obtained by ensuring that all the air driven by the fans passes into the peripheral ducts 30, where cooling occurs, and that the fan-driven air is uniformly distributed throughout all of the ducts 30. It is found that a significant increase of air distribution uniformity is achieved by the use of air distribution baffles within the space 42. As illustrated in FIG. 1, the fan blades rotate around vertical axes and the exit, upper edges of the blades lie in a horizontal plane more or less flush with the upper surface 40b of the shelf. For uniformly distributing the air flow from the four fans 50, baffle means comprising two vertical plates 56 are provided disposed one each overlying and extending between pairs of adjacent fans 50. As shown in FIG. 2, each plate 56 extends fully across the width of the upper space 42 and passes over the axes of rotation of two adjacent fans. Also, the plates extend entirely to the roof 12 of the cabinet. The plates 56 can be secured to the shelf 40, or be suspended from the roof 12, or be portions of self-supporting baffle means simply resting on the shelf 40 and slid into place.

Figure 3:
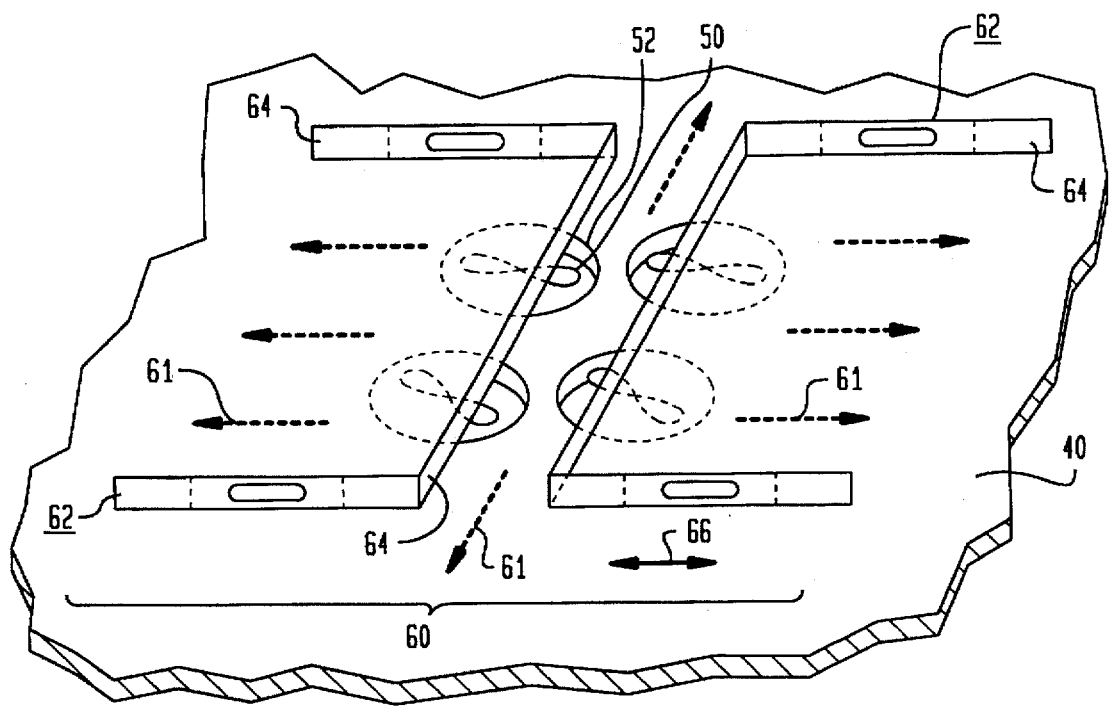
FIG. 3 is a view in perspective of an air baffle usable in the cabinet shown in FIGS. 1 and 2.

As indicated by the arrows 61 in FIG. 2, the presence of the vertical plates 56 controls the distribution of air flow from the fans 50 to the peripheral ducts 30. In general, the arrangement shown in FIG. 2 provides a generally uniform flow distribution. Occasionally, depending upon the particular disposition of the electrical equipment within the cabinet, variations from the generally preferred flow pattern provide better results, and adjustable baffle means, such as shown in FIG. 3 are used so that air flow adjustments can be made on a trial basis.

The illustrated (FIG. 3) adjustable baffle means 60 comprises two generally U-shaped members 62 each comprising three interconnected walls 64, e.g., of metal plates. The members 62 simply rest on the shelf 40, and the various walls 64, which extend substantially to the roof 12 of the cabinet, form ducts for directing the heated air blown by the fans 50 in various lateral directions as indicated by the arrows 61. Adjustments in the air flow patterns can be made simply by repositioning the members 62 on the shelf 40. For providing proper fit of the member 62 relative to the surrounding walls of the cabinet, the walls 64 of the baffle members 62 are preferably adjustable in length, e.g., by having each wall 64 comprise two overlapping plate sections which are slidable relative to one another. Such length adjustability is schematically indicated by the arrow 66 in FIG. 3.

As previously noted, in the cabinet 10 shown in FIGS. 1 and 2, the roof 12 is preferably of high thermal conductivity material for heat exchange therethrough. The roof 12, however, is subject to solar heating which reduces the rate of heat exchange.

Figure 4:
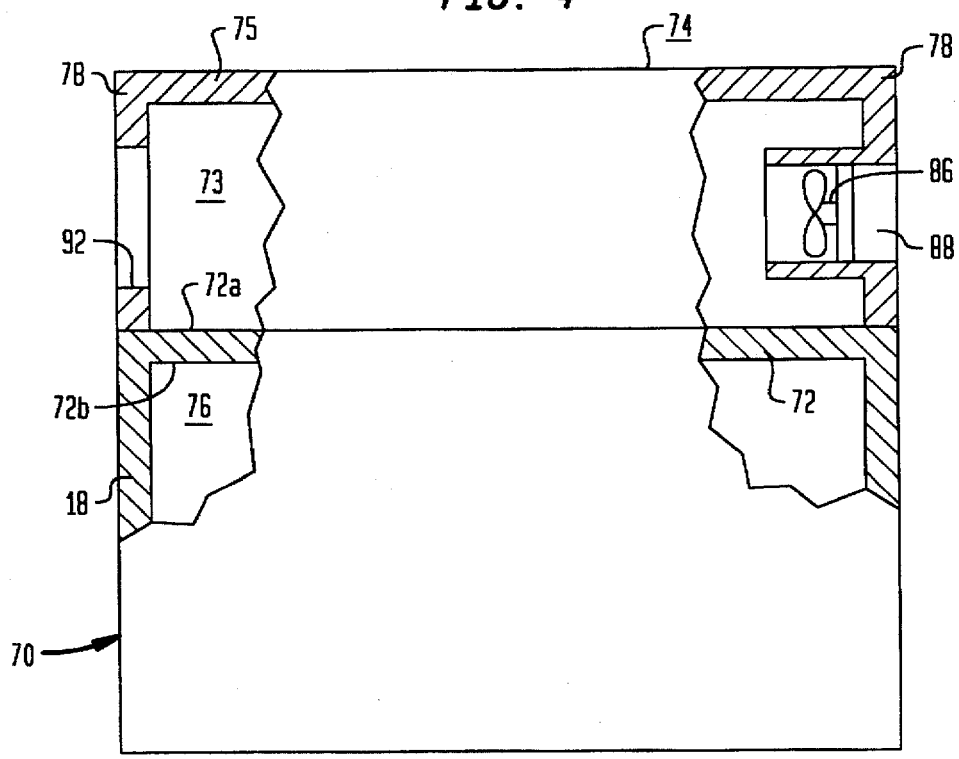
FIG. 4 is a side elevation, partially broken away, of a cabinet in accordance with a "second" cooling arrangement according to the invention.

In accordance with the "second" cooling arrangement according to this invention, a cabinet 70 is shown in FIG. 4 which can be, except as herein noted, identical to the cabinet 10 shown in FIGS. 1 and 2. The cabinet 70 has an "internal" roof 72 which can be identical to the roof 12 in the cabinet 10. Overlying the internal roof 72 is a hollow structure 74 having a roof 75 and side walls 78.

Typically, the cabinet 70 is simply the cabinet 10 with a separate structure 74 mounted thereon. Thus, the roof 72 is actually a rigid, external wall of the cabinet. Alternatively, the structure 74 can be an integral portion of the cabinet 70, in which case, the structure 74, roof 75 and side walls 78 are rigid, external walls of the cabinet. The "internal" roof 72 is thus merely an internal shelf within the cabinet 70.

In either case, the horizontal member 72 ("roof" or "shelf") serves to separate an internal space 75 within the cabinet 70 from outside air (within the hollow structure 74, as hereinafter described), and the horizontal member 72 is used as a heat exchanger between heated air within the space 76 and cooler outside air. Although not shown in FIG. 4, the cabinet 70 and space 76 can be identically formed and used as the space 42 within the cabinet 10 shown in FIGS. 1 and 2. Additionally, the horizontal member 72, as the cabinet 10 and roof 12, is made of a high thermal conductivity material, e.g., aluminum. Both surfaces 72a and 72b of the horizontal member 72 may be covered by extended surfaces (fins) to increase the area available for heat transfer to the air blown through the hollow structure 74.

For cooling the roof 72, hence the underlying space 76, external air is blown through the hollow structure 74 by a fan 86 mounted within an opening 88 through one side wall 78 of the structure 74. An exit opening 92 for the blown air is provided through an oppositely disposed side wall 78. For minimizing solar heating of the space within the hollow structure 74, the roof 75 and side walls 78 thereof are thermally insulated, e.g., covered with layers of thermal insulation of the type typically used within attics or dwellings.

The second cooling arrangement shown in FIG. 4 theoretically can be used without the first arrangement shown in FIGS. 1 and 2 which provides internal circulation of internal air. As a practical matter, this would provide only minor cooling of the cabinet 70 and, when used, the second arrangement is preferably used in conjunction with the first arrangement or with some other internal air cooling arrangement such as those shown in my earlier patent.

As previously explained, a feature of the present invention is the provision of a basically open space (42 in FIG. 1 and 11 76 in FIG. 4) directly underlying a horizontal member (12 or 72) for heat exchange to external air. Heat generating electrical equipment is housed directly beneath this space. To preserve the openness of this space (for force circulation of heated air blown directly therein) cables and other equipments normally filling the top spaces of prior-known cabinets are disposed elsewhere in the cabinet. Linking cables, for example, can be routed through the vertical walls of the cabinet; care being taken to position the cables so as not to block the ducts 30 past the internal surfaces of the vertical walls. Such disposition of the cables and other equipment is a matter of design choice.

The invention claimed is:

1. A cabinet comprising vertically extending, first external walls and second and third horizontally extending walls at opposite ends of the cabinet for defining a cabinet interior space, a shelf extending generally parallel to said second wall sub-dividing said interior space into first and second spaces facing towards said second and third walls, respectively, said second space being for housing of heat generating equipment, and said first space being generally open for free circulation of air therewithin, a fan mounted on said shelf for blowing air from within said second space through an opening through said shelf into said first space and then into a preselected pattern of horizontal air streams directed towards ducts mounted on said first walls for causing flow of said air streams along internal surfaces of said vertical walls and then into said second space.

2. A cabinet according to claim 1 including baffle means disposed within said first space for directing air blown therein into said pattern of air streams.

3. A cabinet according to claim 2 wherein said fan has blades mounted for rotation about a vertical axis, and said baffle means comprises a vertical plate directly overlying said fan for sub-dividing a stream of air exiting said fan into two air streams flowing in opposite directions.

4. A cabinet according to claim 3 including means for adjusting the position of said vertical plate relative to said fan for varying the relative quantities of air flowing in said two air streams.

5. A cabinet according to claim 3 wherein said fan is one of two spaced apart fans similarly mounted in said shelf for blowing air from said second space into said first space, said vertical plate extends across substantially the entire width of said first space between two oppositely disposed first walls, and said vertical plate directly overlies both said fans for distributing the air from both said fans in horizontal directions towards said first walls.

6. A cabinet according to claim 1 wherein said second wall is a top wall of said cabinet and has a high thermal conductivity for enabling cooling of air within said first space by heat exchange through said second wall, and including a hollow structure mounted on said second wall and being hermetically sealed from said first space by said second wall, said hollow structure having a horizontally extending top wall having a low thermal conductivity for minimizing solar heating of the interior of said hollow structure, and means for blowing air external to said cabinet through said hollow structure and across a surface of said second wall, the second wall can have fins on either side (72 and 72a) for additional heat transfer.

7. A cabinet according to claim 1 wherein said ducts on said vertical walls comprise a plurality of flat plates mounted on and in parallel, spaced relation with the interior surface of respective ones of said first walls, each of said plates having oppositely disposed, vertically extending side edges, the side edges of each of said plates being disposed closely adjacent to respective side edges of adjacent plates for forming a continuous annular duct completely encircling said second space.

8. A cabinet according to claim 7 wherein said annular duct has vertically spaced apart first and second open ends, said duct first end being closely positioned to said shelf for being in effectively hermetically sealed communication with said first space, and said duct second end being in communication with said second space at an end thereof remote from said shelf.

9. A cabinet according to claim 1 wherein said second wall is a roof of said cabinet and has a high thermal conductivity for maximizing heat flow through said roof.

* * * * *